United States Patent
Walker et al.

(10) Patent No.: US 8,250,312 B2
(45) Date of Patent: Aug. 21, 2012

(54) CONFIGURABLE MULTI-PORT MEMORY DEVICES AND METHODS

(75) Inventors: Robert Walker, Raleigh, NC (US); Dan Skinner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 583 days.

(21) Appl. No.: 12/432,610

(22) Filed: Apr. 29, 2009

(65) Prior Publication Data

US 2010/0281227 A1 Nov. 4, 2010

(51) Int. Cl.
*G06F 13/20* (2006.01)
(52) U.S. Cl. .................... 711/149; 711/147
(58) Field of Classification Search .............. 711/149, 711/147; 710/316, 317
See application file for complete search history.

(56) References Cited

U.S. PATENT DOCUMENTS

| 4,930,066 | A | * | 5/1990 | Yokota ...................... 711/149 |
| 5,515,523 | A | | 5/1996 | Kalkunte et al. .............. 395/476 |
| 6,088,760 | A | * | 7/2000 | Walker et al. ................. 711/104 |
| 2002/0194424 | A1 | | 12/2002 | Hasegawa et al. ............ 711/104 |
| 2010/0281227 | A1 | * | 11/2010 | Walker et al. ................. 711/149 |

OTHER PUBLICATIONS

International Search Report and Written Opinion, International Application No. PCT/US2010/027867, filed Mar. 18, 2010, 8 pages.

* cited by examiner

*Primary Examiner* — Andrew Q Tran
(74) *Attorney, Agent, or Firm* — Dorsey & Whitney LLP

(57) ABSTRACT

Embodiments of a multi-port memory device may include a plurality of ports and a plurality of memory banks some of which are native to each port and some of which are non-native to each port. The memory device may include a configuration register that stores configuration data indicative of the mapping of the memory banks to the ports. In response to the configuration data, for example, a steering logic may couple each of the ports either to one or all of the native memory banks or to one or all of the non-native memory banks.

11 Claims, 7 Drawing Sheets

CONFIGURABLE MULTI-PORT MEMORY DEVICES AND METHODS

TECHNICAL FIELD

Embodiments of this invention relate to memory devices, and, more particularly, to a multi-port memory device.

BACKGROUND OF THE INVENTION

A wide variety of memory devices are in common use. One type of memory device that is becoming increasingly popular are memory devices that have a plurality of input/output ("I/O") ports. Prior art multi-port memory devices normally have a fixed memory capacity that is accessible through each port. For example, a 1 Gb memory device having 4 ports would normally have 256 Mb of storage accessible through each port. The fixed capacity per port approach is satisfactory for many applications. However, many applications require a memory device in which different memory access devices coupled to the memory device through respective ports having different data storage requirements. In such case, the tradeoff is either to have insufficient capacity available to some memory access devices or to have excessive capacity available to other memory access devices. Either approach results in some performance or cost disadvantages.

One solution to the above limitations of the fixed capacity per port approach may be to provide different fixed capacities for each of several ports. For example, in the above-described 1 Gb memory device having 4 ports, a processor may require 512 Mb of capacity and would thus access the memory device through a port with 512 Mb available, a baseband processor may require 256 Mb of capacity and would thus access the memory device through a port with 256 Mb available, and two other memory access devices may each require 128 Mb of capacity and would thus access the memory device through respective ports with 128 Mb accessible through each port. While this approach might be ideal for some applications, it may not be acceptable for other applications. For example, another user of the memory device might need a memory device with 256 Mb accessible through each of the 4 ports or a memory device with 512 Mb accessible through one port, 256 Mb accessible through 2 ports, and no capacity accessible through the 4$^{th}$ port. While this approach could be alleviated to some extent by manufacturing memory devices having a wide variety of port configurations, this approach would require memory device manufacturers to design, manufacture, stock and sell a large number of different memory devices. The cost of this approach would undoubtedly result in such memory devices being relatively expensive.

There is therefore not an entirely acceptable solution for the need for multi-port memory devices having a wide variety of port configurations.

DETAILED DESCRIPTION

Figure 1A:
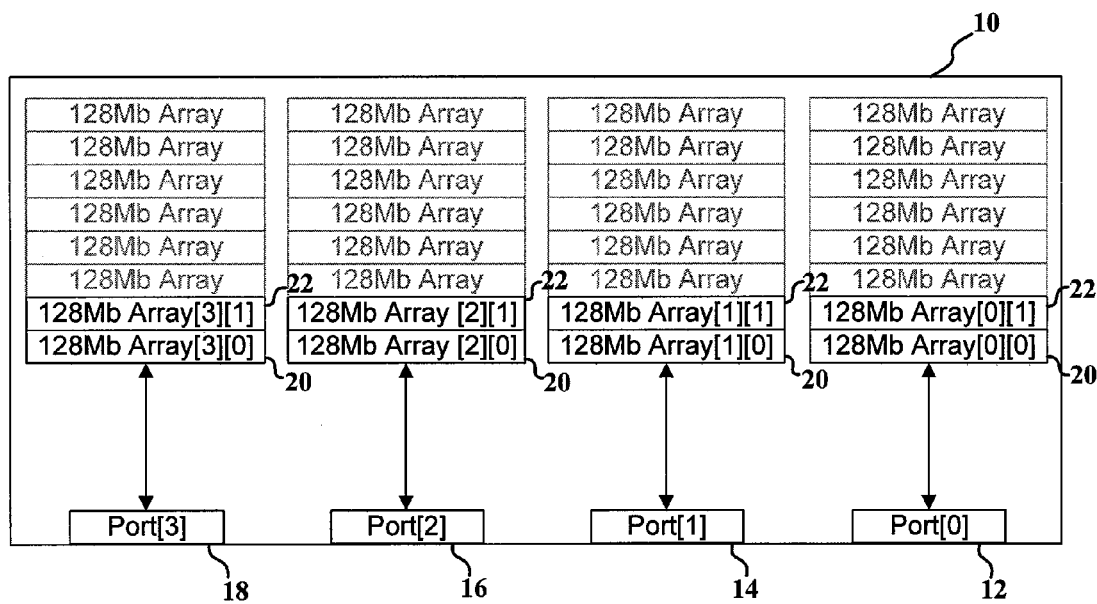
FIGS. 1A-C are schematic drawings showing an embodiment of a multi-port memory device in which banks can be mapped to another port by bank consolidation.
Figure 1B:
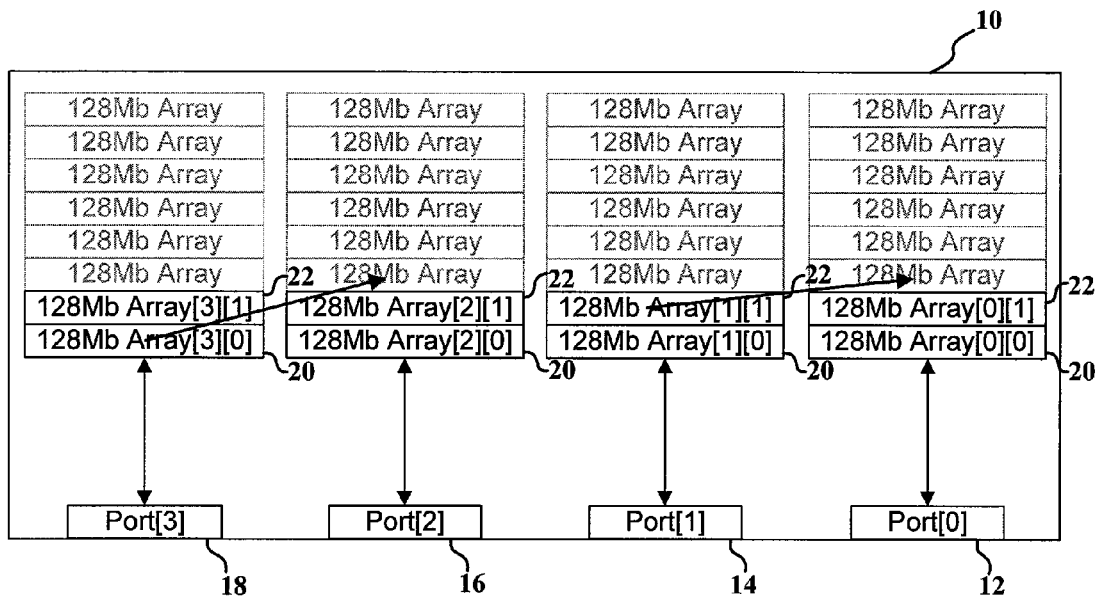
Figure 1C:
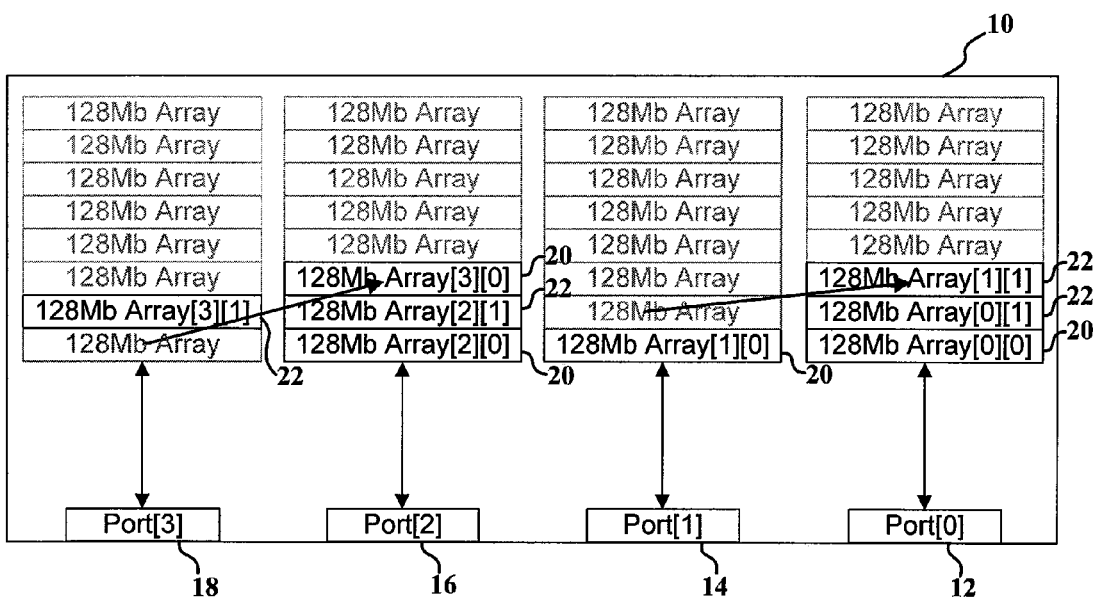

A memory device according to one embodiment of the invention is shown in FIGS. 1A-1C. As shown in FIG. 1A, a memory device 10 includes 4 ports 12, 14, 16, 18 each of which can access two 128 Mb banks 20, 22 of memory cells, which can be dynamic random access memory ("DRAM") cells, static random access memory ("SRAM") memory cells, flash memory cells, or any other type of presently existing or hereafter developed memory cells. The memory device 10 thus has a capacity of 1 Gb, and each port 12-18 can access 256 Mb. The banks 20, 22 that are accessible from their respective port 12-18 are referred to herein as "native" banks.

As explained in greater detail below, the memory device is configurable by a user to alter the memory capacity that may be accessible through each of the ports 12-18. As shown in FIG. 1B, the memory bank 22 native to port 14 can be mapped to the port 12, and the memory bank 20 native to the port 18 can be mapped to the port 16. The banks that have been mapped to another port are referred to herein as "non-native" banks. After the memory device 10 has been reconfigured, 384 Mb are accessible to the ports 12, 16, and 128 Mb of capacity are accessible to the ports 14, 18, as shown in FIG. 1C. Thus, two native banks 20, 22 and one non-native bank 22 can be accessed through the port 12, two native banks 20, 22 and one non-native bank 20 can be accessed through the port 16, one native bank 20 can be accessed through the port 14, and one native bank 22 can be accessed through the port 18. Other configurations are, of course, possible. Mapping of a bank from one port to another is referred to herein as "bank consolidation."

Figure 2A:
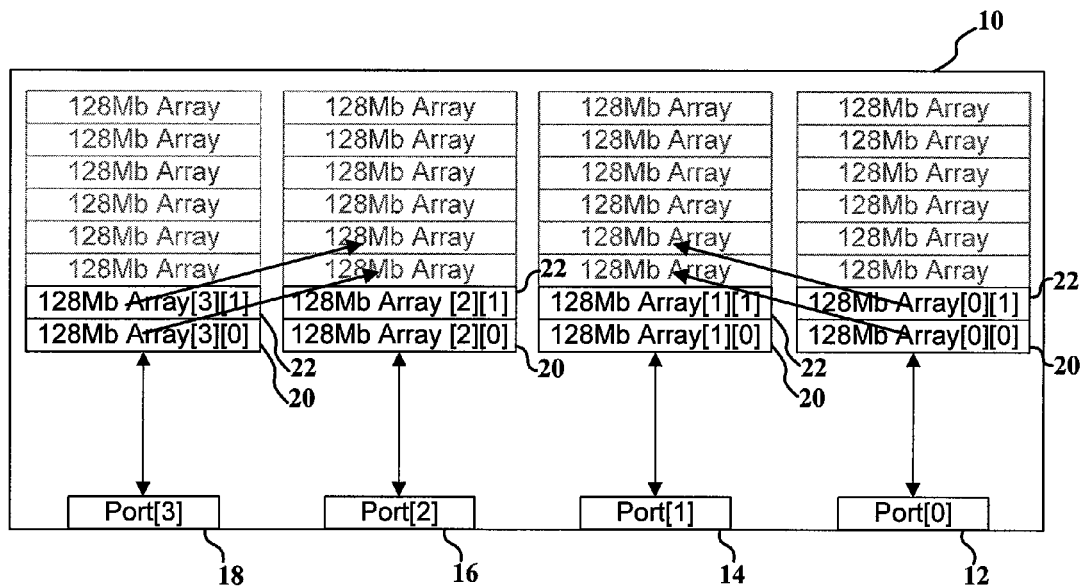
FIGS. 2A and 2B are schematic drawings showing an embodiment of a multi-port memory device in which banks can be mapped to another port by port consolidation.
Figure 2B:
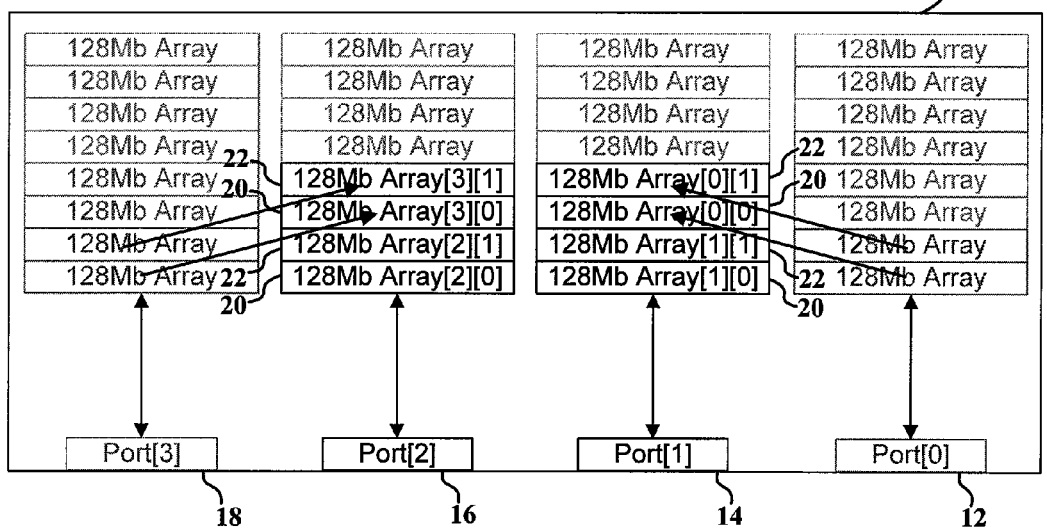

As further shown in FIG. 2A, both banks 20, 22 native to the port 12 can be mapped to the port 14, and both banks 20, 22 native to the port 18 can be mapped to the port 16. As a result, two native banks 20, 22 and two non-native banks 20, 22 can be accessed through the port 14, and two native banks 20, 22 and two non-native banks 20, 22 can be accessed through the port 16, as shown in FIG. 2B. After the memory device 10 has been reconfigured, no memory cells can be accessed through the ports 12, 18. Thus, the memory device 10 may be reconfigured to be a two-port memory device having 512 Mb accessible through each of the ports 14, 16. Mapping of all of the banks 20, 22 native to one port to a different port is referred to herein as "port consolidation."

Figure 3A:
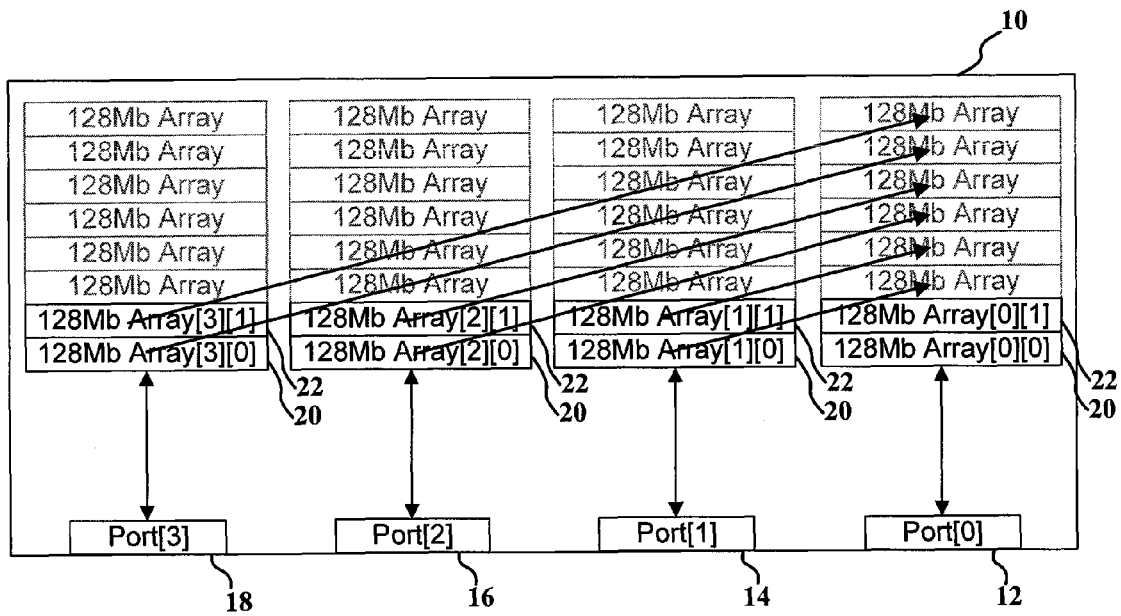
FIGS. 3A and 3B are schematic drawings showing another embodiment of a multi-port memory device in which banks can be mapped to another port by port consolidation.
Figure 3B:
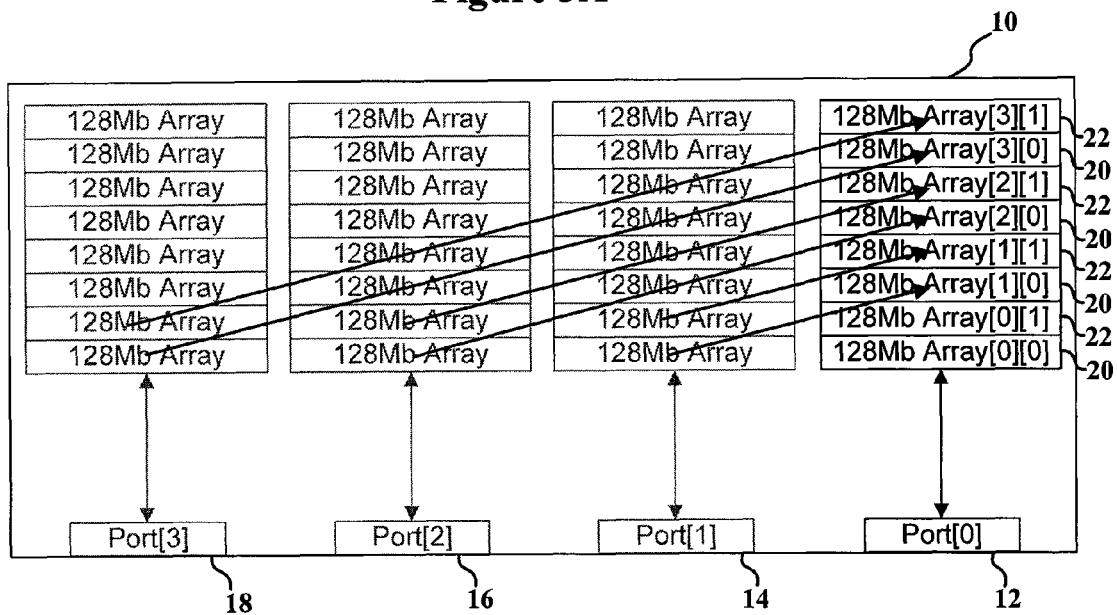

Another example of port consolidation is shown in FIG. 3A. As shown therein, both banks 20, 22 native to each of the ports 14-18 can be mapped to the port 12. As a result, two native banks 20, 22 and six non-native banks 20, 22 can be accessed through the port 12, as shown in FIG. 3B. Thus, bank consolidation results in the memory device being a single-port memory device having 1 Gb accessible through the port 12.

Although the memory device 10 shown in FIGS. 1A-3B has the same number ports and the same number of native banks for each port, in other embodiments different numbers of ports are provided, and different numbers of banks are native to each port. Alternatively or in addition, in still other embodiments, the memory capacity of the banks native to each of several ports can vary from port to port. For example, in one embodiment, one 64 Mb bank may be native to a first port, one 128 Mb bank may be native to a second port, one 256 Mb bank and one 32 Mb bank are native to a third port, one 256 Mb bank, one 128 Mb bank, and one 64 Mb bank are native to a fourth port, and one 64 Mb bank and one 32 Mb bank are native to a fifth port. Other native configurations, of course, may be used in other embodiments.

The reconfiguration of the memory device 10 may be accomplished using a variety of techniques. For example, in one embodiment, port consolidation may be accomplished by controlling all banks, both native and non-native, accessible through each port by a register (not shown) associated with the port to which the banks have been mapped. In contrast, in one embodiment, bank consolidation may be accomplished by controlling banks mapped to another port by a register (not shown) associated with the port from which the banks are mapped. However, in another embodiment, bank consolidation may be accomplished by controlling banks mapped to another port by a register (not shown) associated with the port to which the bank is mapped.

The mapping of banks to provide bank and port consolidation may also be accomplished by using devices other than a programmable register. For example, in one embodiment, bank or port consolidation may be accomplished by selecting which banks to map by altering the manner in which bonding wires are connected to contact pads on a semiconductor substrate. However, the mapping of banks may be controlled by blowing a fuse or anti-fuse. In still other embodiments, the selection of which bank to map and the port to which it should be mapped may be controlled by tying an externally accessible terminal to a pre-defined voltage, such as $V_{CC}$ or ground. Other selection means can also be used.

One example showing the manner in which banks can be addressed after bank or port consolidation from port 1 into port 2 is shown in Table A, below:

TABLE A

| Bank Address | Bank | Bank Source |
| --- | --- | --- |
| 0 | Native 0 | Port 0, Bank 0 |
| 1 | Native 1 | Port 0, Bank 1 |
| 2 | Non-Native 0 | Port 1, Bank 0 |
| 3 | Non-Native 1 | Port 1, Bank 1 |

As shown in Table A, when the banks of port 1 are mapped to port 0, the port 0 banks still maintain their port 0 and port 1 addresses. Thus, a bank address of 0 may still be used to address bank 0 of port 0, and a bank address of 1 may still be used to address bank 1 of port 0. However, if a bank address of 2 or 3 is applied to port 0, the banks of port 1 may be addressed. Specifically, as also shown in Table, A, a bank address of 2 may be used to address bank 0 of port 1, and a bank address of 3 may be used to address bank 1 of port 1. A similar addressing scheme can be used for bank or port consolidation from any port to any other port.

Figure 4:
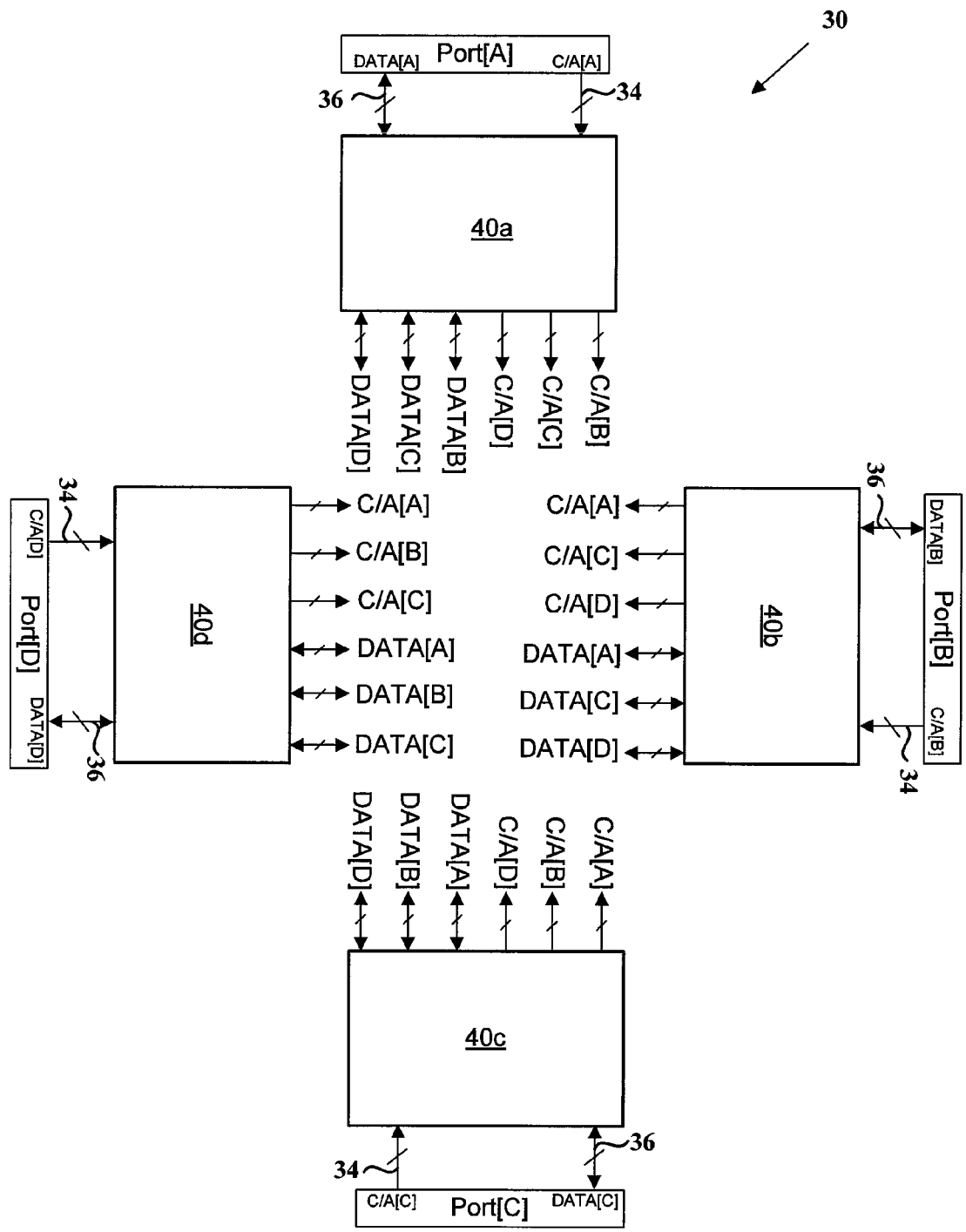
FIG. 4 is a block diagram of a multi-port memory device according to one embodiment of the invention.

A multi-port memory device 30 according to one embodiment is shown in FIG. 4. The memory device 30 has 4 ports A-D, although other embodiments may have a number of ports less than or greater than 4. The ports A-D each have a combined unidirectional command/address ("C/A") 34 bus and a bidirectional data bus ("DATA") 36 coupled between its port and a switching circuit or a mapping circuit, such as respective Bank/Port circuits 40a-d. Each Bank/Port circuit is coupled not only to its respective native port, but also to each of the other ports. Thus, for example, the Bank/Port circuit 40a for Bank A is coupled not only to the C/A[A] and DATA [A] buses, but also to the C/A[B], DATA[B], C/A[C], DATA [C], C/A[D] and DATA[D] buses.

Figure 5:
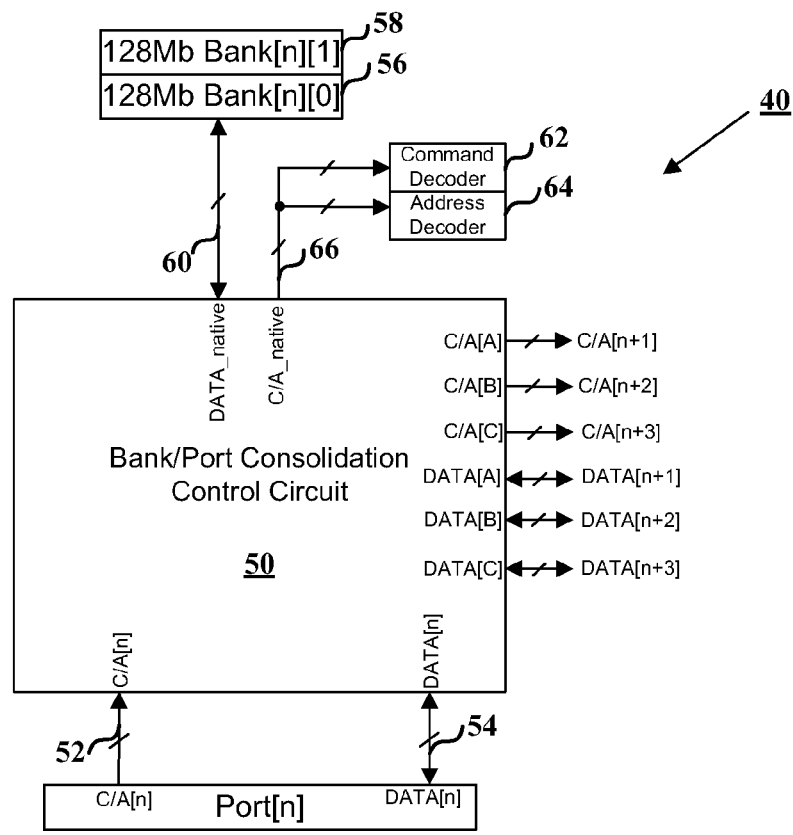
FIG. 5 is a block diagram of an embodiment of a Bank/Port circuit that may be used in the memory device of FIG. 4.

The Bank/Port circuits 40a-d are, in the embodiment shown in FIG. 4, substantially identical to each other. An embodiment of the Bank/Port circuits 40a-d used as a switching circuit or mapping circuit is shown in FIG. 5. The Bank/Port circuit 40 includes a respective Bank/Port consolidation control circuit 50 coupled to its respective Port[n] through a C/A[n] bus 52 and a DATA[n] bus 54 as well as to all of the ports, as explained above. The Bank/Port circuit 40 also includes two banks 56, 58 of memory cells, which may be referred to as Bank[n][0] and Bank[n][1], respectively, where the letter "n" designates the port to which the bank is native. The banks 56, 58 are coupled to the Bank/Port consolidation control circuit 50 through a DATA_native bus 60. Although the Bank/Port circuit 40a embodiment shown in FIG. 5 uses two banks for each port, a number of banks greater than or less than 2 may be used in other embodiments. The Bank/Port circuit 40a also includes a respective command decoder 62 and a respective address decoder 64, both of which are coupled to the Bank/Port consolidation control circuit 50 through a C/A_native bus 66.

Figure 6:
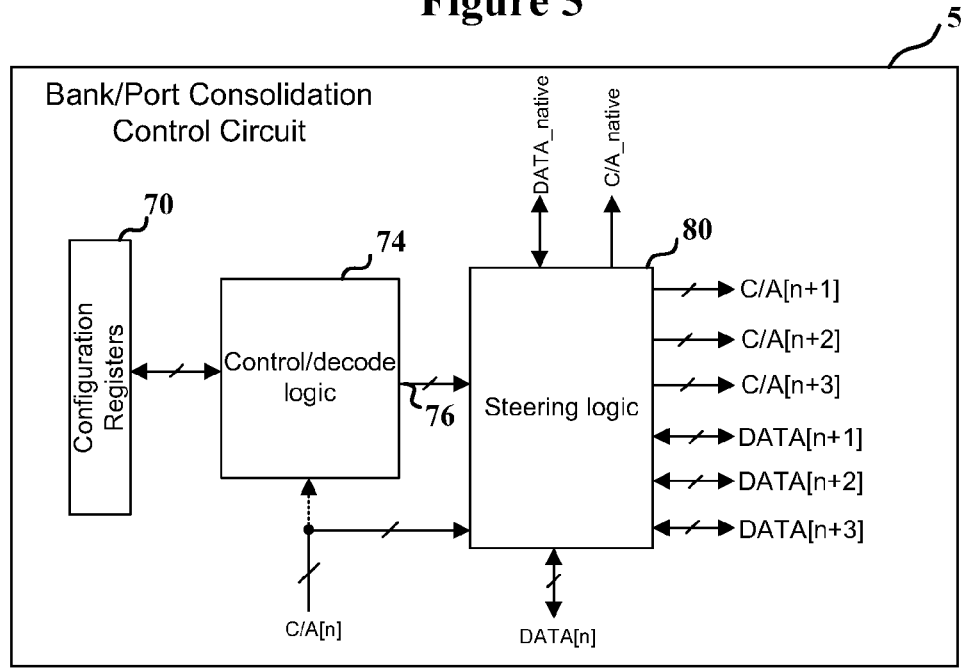
FIG. 6 is a block diagram of an embodiment of a Bank/Port consolidation control circuit that may be used in the Bank/Port circuit of FIG. 5.

The Bank/Port consolidation control circuit 50 according to one embodiment is shown in FIG. 6. The Bank/Port consolidation control circuit 50 includes configuration registers 70 that store configuration data indicative of the manner in which any port or bank consolidation is to be accomplished. The configuration registers 70 generate a code indicative of consolidation data, which is passed to control/decode logic 74. The control/decode logic 74 decodes the configuration data from the configuration registers and generates control signals on bus 76 that cause steering logic 80 to map the banks 56, 58 (FIG. 5) that are native to that port to the respective port to which they are to be mapped. In some embodiments, the configuration registers 70 can be dynamically programmed by the control/decode logic 74 receiving data through the C/A[n] bus indicative of how the configuration registers should be programmed (which is why the connection of the C/A[n] bus to the logic 74 is shown in dashed lines). The control/decode logic 74 can then program the configuration registers 70 accordingly. However, in other embodiments the programming of the configuration registers 70 is static, which the configuration registers 70 being formed by anti-fuses, fuses or other programmable elements that are programmed either during fabrication by a manufacturer or afterwards by a user.

With further reference to FIG. 6, the steering logic 80 responds to the control signals generated by the control/decode logic 74 to couple the commands from either the native C/A[n] bus or one of the non-native C/A[n] buses to the C/A_native bus, and the data to and from either the native DATA[n] bus or one of the non-native DATA[n] buses to the DATA_native bus. The steering logic 80 can be implemented, for example, as sets of multiplexers. As explained above, the DATA_native bus is coupled to the native banks 56, 58 (FIG. 5) of memory cells, and the C/A_native bus 66 is coupled to the command decoder 62 and the address decoder 64. The steering logic 80 can therefore effectively map either or both of the native banks 56, 58 to any of the four ports depending on the needs of each port.

Figure 7:
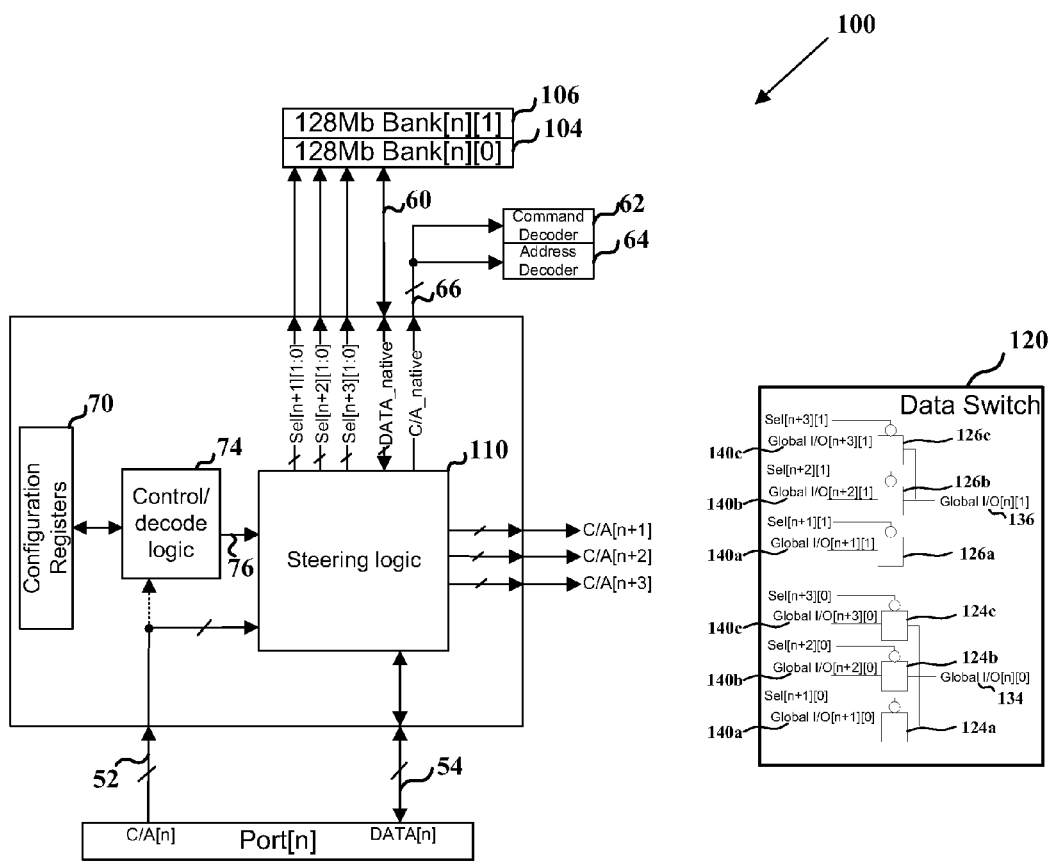
FIG. 7 is a block diagram of another embodiment of a Bank/Port circuit that may be used in the memory device of FIG. 4.

Another embodiment of the Bank/Port circuits 40a-d is shown in FIG. 7. The Bank/Port circuit 40 includes a respective Bank/Port consolidation control circuit 100 coupled to its respective Port[n] through the C/A[n] bus 52 and the DATA [n] bus 54. The Bank/Port consolidation control circuit 100 is also coupled to all of the ports, as explained above with reference to FIG. 4. The Bank/Port circuit 40 also includes two banks 104, 106 of memory cells, which again may be referred to as Bank[n][0] and Bank[n][1], respectively. The Bank/Port consolidation control circuit 100 is somewhat similar to the Bank/Port consolidation control circuit 50 of FIG. 6. Specifically, the Bank/Port consolidation control circuit 100 also includes the configuration registers 70 that store configuration data as well as the control/decode logic 74 that decodes the configuration data from the configuration registers 70 and generates control signals on bus 76 that cause steering logic 110 to map the banks 104, 106 that are native to that port to the respective port. The Bank/Port consolidation control circuit 100 also includes the command decoder 62 and the address decoder 64 coupled to the steering logic 110 through the C/A_native bus 66. The steering logic 110 also selectively couples the C/A bus 54 to the C/A_native bus 66 or to the non-native C/A buses. However, the steering logic 110 differs from the steering logic 80 shown in FIG. 6 in that it selectively couples the DATA[n] bus 54 only to the DATA_native bus 60. The steering logic 110 also generates 2-bit Sel[n+1][1:0], Sel[n+2][1:0], Sel[n+3][1:0] signals that cause data to be coupled from one of the non-native banks to the DATA[n] bus 54. Specifically, the Bank/Port circuits 40 includes a data switch 120 that includes a first set of pass gates 124*a,b,c* and a second set of pass gates 126*a,b,c*. The pass gates 124, 126 may be in the native banks 104, 106, respectively, and may be coupled to global I/O buses 134, 136 in the banks 104, 106, respectively. As understood by one skilled in the art, global I/O buses or lines are commonly found in memory arrays for coupling all of the data in the array to a circuit that outputs the data from the memory device. Each of the pass gates 124*a-c* is switched by the "0" bit of a respective Sel signal to selectively couple a global I/O bus 140*a-c* of a respective non-native Bank[0] to the global I/O bus 134, which is coupled to the DATA_native bus. For example, in response to the Sel[n+2] signal, the pass gate 124*b* couples the global I/O[n+2][0] bus from Bank[n+1][0] to the native global I/O bus[n][0], which is, in turn, coupled to the DATA[n] port through the Bank/Port consolidation control circuit 100. In a similar manner, each of the pass gates 126*a-c* is switched by the "1" bit of a respective Sel signal to selectively couple a global I/O bus 140*a-c* of a respective non-native Bank[1] to the global I/O bus 136, which is coupled to the DATA_native bus. Although the pass gates 124, 126 of the switch 120 are located in the banks in the embodiment of FIG. 7, it will be understood that the bass gates 124, 126 or other switching circuits can be at other locations in other embodiments.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

We claim:

1. A memory device, comprising:
   a plurality of ports, each of the ports being coupled to at least one native memory bank; and
   a bank/port circuit configured to selectively map the at least one native memory bank coupled to a respective one of the ports to another of the ports;
   wherein a respective capacity accessible through each respective port is configurable.

2. The memory device of claim 1 wherein each of the ports comprise a respective unidirectional command/address bus and a respective bidirectional data bus.

3. The memory device of claim 1, further comprising an externally accessible terminal, and wherein the bank/port circuit is configured to be responsive to a signal applied to the externally accessible terminal to control the manner in which the at least one native memory bank coupled to a respective one of the ports is mapped to another of the ports.

4. The memory device of claim 1, further comprising at least one bonding wire coupled to one of a plurality of contact pads, and wherein the bank/port circuit is configured to be responsive to which of the contact pads to which the bonding wire is coupled to control the manner in which the at least one native memory bank coupled to a respective one of the ports is mapped to another of the ports.

5. The memory device of claim 1, wherein the at least one native memory bank is configured to be accessible from the port to which it is coupled without mapping from another port.

6. A memory device, comprising:
   a plurality of ports, each of the ports being coupled to at least one memory bank; and
   a bank/port circuit configured to selectively map the at least one memory bank coupled to a respective one of the ports to another of the ports, the bank/port circuit comprising:
   a configuration register configured to store configuration data indicative of the manner in which each of the at least one banks coupled to the respective one of the ports are to be mapped;
   a command decoder;
   an address decoder; and
   a switching circuit coupled to the configuration register, each of the ports, the switching circuit being configured to be responsive to any configuration data received from the configuration register to selectively couple the command decoder and the address decoder to either a command/address bus of the respective one of the ports or a command/address bus on another one of the ports.

7. The memory device of claim 6 wherein the switching circuit is further configured to be responsive to the configuration data received from the configuration register to generate one of a plurality of select signals each of which corresponds to a respective one of the memory banks, and wherein the switching circuit is further configured to be responsive to the select signals to couple data between the respective one of the ports and respective memory banks corresponding to the select signals.

8. The memory device of claim 6 wherein the configuration register and the switching circuit comprises a consolidation control circuit, the consolidation control circuit being one of a plurality of consolidation control circuits, each of the consolidation control circuits being coupled to a respective one of the ports and being configured to selectively couple the at least one memory bank of the respective port to any of the other ports.

9. A memory device, comprising:
   a plurality of ports, each of the ports being coupled to at least one memory bank; and
   a bank/port circuit configured to selectively map the at least one memory bank coupled to a respective one of the ports to another of the ports, the bank/port circuit comprising:
   a configuration register storing configuration data indicative of the manner in which each of the ports are to be mapped to the memory banks for each of the ports; and a switching circuit coupled to the configuration register, each of the ports and each of the memory banks, the switching circuit being configured to be responsive to the configuration data received from the configuration register to couple the data bus of each of the ports to the memory banks corresponding to a respective select signals.

10. The memory device of claim 9 wherein the switching circuit is configured to couple the data bus of each of the ports to a respective global input/output bus of each of the memory banks corresponding to a respective select signals.

11. A memory device, comprising:
a plurality of ports, each of the ports being coupled to at least one memory bank; and
a bank/port circuit configured to selectively map the at least one memory bank coupled to a respective one of the ports to another of the ports;
wherein the at least one memory bank comprises a plurality of memory banks coupled to a respective one of the ports, and wherein the bank/port circuit comprises a programmable configuration register coupled to receive from the respective port configuration data indicative of the manner in which each of a plurality of memory banks is mapped to another of the ports, the configuration register being configured to store the received configuration data.

* * * * *

UNITED STATES PATENT AND TRADEMARK OFFICE
CERTIFICATE OF CORRECTION

| | | |
|---|---|---|
| PATENT NO. | : 8,250,312 B2 | Page 1 of 1 |
| APPLICATION NO. | : 12/432610 | |
| DATED | : August 21, 2012 | |
| INVENTOR(S) | : Robert Walker et al. | |

It is certified that error appears in the above-identified patent and that said Letters Patent is hereby corrected as shown below:

In column 7, line 7, in Claim 9, delete "signals." and insert -- signal. --, therefor.

In column 7, line 11, in Claim 10, delete "signals." and insert -- signal. --, therefor.

Signed and Sealed this
Twenty-third Day of October, 2012

David J. Kappos
*Director of the United States Patent and Trademark Office*